(12) United States Patent
Kwon et al.

(10) Patent No.: US 10,056,321 B2
(45) Date of Patent: Aug. 21, 2018

(54) SEMICONDUCTOR PACKAGE AND METHOD FOR ROUTING THE PACKAGE

(71) Applicants: Heung-Kyu Kwon, Seongnam-si (KR); Jong-Kook Kim, Hwaseong-si (KR)

(72) Inventors: Heung-Kyu Kwon, Seongnam-si (KR); Jong-Kook Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 4 days.

(21) Appl. No.: 14/068,560

(22) Filed: Oct. 31, 2013

(65) Prior Publication Data
US 2014/0159237 A1 Jun. 12, 2014

(30) Foreign Application Priority Data

Dec. 10, 2012 (KR) .................. 10-2012-0142786

(51) Int. Cl.
*H01L 23/00* (2006.01)
*H01L 23/498* (2006.01)
(Continued)

(52) U.S. Cl.
CPC .. *H01L 23/49816* (2013.01); *H01L 23/49838* (2013.01); *H01L 24/04* (2013.01);
(Continued)

(58) Field of Classification Search
CPC ....... H01L 23/49816; H01L 2224/0401; H01L 2224/16227; H01L 23/49822; H01L 23/49827; H01L 23/49838; H01L 23/49833; H01L 2224/48227; H01L 2224/04042; H01L 25/043; H01L 25/0657; H01L 25/074; H01L 25/117;
(Continued)

(56) References Cited

U.S. PATENT DOCUMENTS 6,104,258 A * 8/2000 Novak ............... H03H 7/38
333/22 R
6,232,660 B1 * 5/2001 Kakimoto et al. ........... 257/728
(Continued)

FOREIGN PATENT DOCUMENTS

CN 1433252 A 7/2003
JP 2004-165605 A 6/2004
(Continued)

OTHER PUBLICATIONS

Chinese Office Action dated Apr. 28, 2017.

*Primary Examiner* — Pauline Vu
(74) *Attorney, Agent, or Firm* — Harness, Dickey & Pierce, P.L.C.

(57) ABSTRACT

A semiconductor package having improved performance and reliability and a method of fabricating the same are provided. The semiconductor package includes a processing chip including a first pin at a first side to output a first signal, and a second pin at a second side to output a second signal different from the first signal, and a substrate having the processing chip thereon, the substrate including a first bump ball electrically connected to the first pin and a second bump ball electrically connected to the second pin, wherein the first bump ball and the second bump ball are adjacent at one of the first and second sides of the substrate.

23 Claims, 14 Drawing Sheets

(51) Int. Cl.
*H01L 25/065* (2006.01)
*H01L 25/11* (2006.01)
*H01L 25/07* (2006.01)

(52) U.S. Cl.
CPC .............. *H01L 24/06* (2013.01); *H01L 24/16* (2013.01); *H01L 24/48* (2013.01); *H01L 25/0657* (2013.01); *H01L 25/071* (2013.01); *H01L 25/115* (2013.01); *H01L 25/117* (2013.01); *H01L 2224/0401* (2013.01); *H01L 2224/04042* (2013.01); *H01L 2224/06155* (2013.01); *H01L 2224/16225* (2013.01); *H01L 2224/16227* (2013.01); *H01L 2224/48227* (2013.01)

(58) Field of Classification Search
CPC . H01L 25/042; H01L 25/0655; H01L 25/072; H01L 25/0753; H01L 25/115; H01L 2224/16225; H01L 2224/06155
USPC .......................................................... 257/738
See application file for complete search history.

(56) References Cited

U.S. PATENT DOCUMENTS

| | | | |
|---|---|---|---|
| 6,812,565 B2 | 11/2004 | Nishimoto et al. | |
| 6,965,170 B2 | 11/2005 | Memis | |
| 7,352,602 B2 | 4/2008 | Janzen | |
| 7,700,409 B2* | 4/2010 | Jensen | H01L 25/0657 |
| | | | 257/686 |
| 8,618,632 B2* | 12/2013 | Kawashima | H01L 23/50 |
| | | | 257/532 |
| 2003/0128602 A1* | 7/2003 | Nishimoto et al. | 365/200 |
| 2004/0024955 A1* | 2/2004 | Patel | 711/100 |
| 2004/0061147 A1* | 4/2004 | Fujita | G06F 11/261 |
| | | | 257/232 |
| 2004/0087058 A1* | 5/2004 | Ooi | H01L 21/6835 |
| | | | 438/106 |
| 2004/0227222 A1* | 11/2004 | Kikuchi | H01L 23/5383 |
| | | | 257/686 |
| 2004/0245617 A1* | 12/2004 | Damberg | H01L 25/0652 |
| | | | 257/686 |
| 2005/0195629 A1* | 9/2005 | Leddige | G11C 5/02 |
| | | | 365/51 |
| 2005/0280146 A1* | 12/2005 | Cornelius | 257/730 |
| 2006/0012966 A1* | 1/2006 | Chakravorty | 361/763 |
| 2006/0103004 A1* | 5/2006 | Sakai | H01L 23/49822 |
| | | | 257/700 |
| 2006/0186524 A1* | 8/2006 | Aiba et al. | 257/686 |
| 2006/0192282 A1* | 8/2006 | Suwa et al. | 257/723 |
| 2006/0227587 A1* | 10/2006 | Nakamura et al. | 365/63 |
| 2006/0235577 A1* | 10/2006 | Ikeda et al. | 701/1 |
| 2007/0070669 A1* | 3/2007 | Tsern | G11C 5/02 |
| | | | 365/51 |
| 2007/0144770 A1* | 6/2007 | Nakao | H05K 1/0225 |
| | | | 174/260 |
| 2007/0192559 A1* | 8/2007 | Betsui et al. | 711/167 |
| 2007/0194433 A1* | 8/2007 | Suwa | H01L 23/49838 |
| | | | 257/700 |
| 2007/0289771 A1* | 12/2007 | Osaka | H01L 23/66 |
| | | | 174/250 |
| 2008/0012107 A1* | 1/2008 | Isa | H01L 23/49838 |
| | | | 257/678 |
| 2008/0116557 A1* | 5/2008 | Paek | H01L 25/0657 |
| | | | 257/686 |
| 2008/0203554 A1* | 8/2008 | Nishio et al. | 257/686 |
| 2008/0237848 A1* | 10/2008 | Yoshikawa | G11C 5/02 |
| | | | 257/723 |
| 2008/0258259 A1* | 10/2008 | Osaka | H01L 23/481 |
| | | | 257/532 |
| 2009/0101896 A1* | 4/2009 | Shinagawa | 257/48 |
| 2009/0218675 A1* | 9/2009 | Kwon | 257/690 |
| 2011/0193086 A1* | 8/2011 | Lee | G11C 5/025 |
| | | | 257/48 |
| 2011/0291295 A1* | 12/2011 | Isa | H01L 21/6836 |
| | | | 257/777 |
| 2011/0317475 A1* | 12/2011 | Suwa | G11C 5/04 |
| | | | 365/149 |
| 2012/0136596 A1* | 5/2012 | Yamaoka et al. | 702/64 |
| 2012/0171814 A1* | 7/2012 | Choi et al. | 438/107 |
| 2012/0187564 A1* | 7/2012 | Tsuge et al. | 257/773 |
| 2012/0206954 A1* | 8/2012 | Yoshikawa | G11C 5/063 |
| | | | 365/63 |
| 2012/0299197 A1 | 11/2012 | Kwon et al. | |
| 2013/0044554 A1* | 2/2013 | Goel et al. | 365/200 |
| 2013/0111123 A1* | 5/2013 | Thayer | 711/105 |
| 2013/0134553 A1* | 5/2013 | Kuo et al. | 257/532 |
| 2013/0176764 A1* | 7/2013 | Lee | G11C 5/04 |
| | | | 365/63 |
| 2014/0115199 A1* | 4/2014 | Yoshikawa | G06F 13/4068 |
| | | | 710/51 |

FOREIGN PATENT DOCUMENTS

| | | |
|---|---|---|
| JP | 2007-095970 A | 4/2007 |
| JP | 2009-070965 A | 4/2009 |
| JP | 2010-157561 A | 7/2010 |
| KR | 10-0701707 B1 | 3/2007 |
| KR | 10-0753127 B1 | 8/2007 |
| KR | 10-1069517 B1 | 9/2011 |

* cited by examiner

: 122

: 124

1000

SEMICONDUCTOR PACKAGE AND METHOD FOR ROUTING THE PACKAGE

CROSS-REFERENCE TO RELATED APPLICATION

This application claims priority from Korean Patent Application No. 10-2012-0142786 filed on Dec. 10, 2012 in the Korean Intellectual Property Office, and all the benefits accruing therefrom under 35 U.S.C. § 119, the contents of which in its entirety are herein incorporated by reference.

BACKGROUND

1. Technical Field

Example embodiments relate to a semiconductor package and a method for routing the package.

2. Description of the Related Art

Semiconductor packages have been developed in the direction of satisfying demands for multifunction, high capacity, and miniaturization.

For this, a system in package (SIP) technology, in which several semiconductor packages are integrated into one semiconductor package to achieve the high capacity and multifunction and to reduce the size of the semiconductor package, has been proposed.

SUMMARY

In the SIP technology, signal integrity (SI) or power integrity (PI), which is a factor of the performance of the entire package, is affected by routing between a chip or a sub package. That is to say, if a routing path between a chip or a sub package is unnecessarily lengthened, noises may be generated, resulting in lowered power efficiency of the entire package.

Example embodiments provide a semiconductor package having improved performance and reliability.

Example embodiments also provide a method for routing a semiconductor package having improved performance and reliability.

These and other objects of example embodiments will be described in or be apparent from the following description of example embodiments.

According to example embodiments, there is provided a semiconductor package including a processing chip including a first pin at a first side of the processing chip to output a first signal, and a second pin at a second side of the processing chip to output a second signal different from the first signal, and a substrate having the processing chip thereon, the substrate including a first bump ball electrically connected to the first pin and a second bump ball electrically connected to the second pin, wherein the first bump ball and the second bump ball are adjacent at one of first and second sides of the substrate.

According to example embodiments, there is provided a semiconductor package including a base board, a first package on the base board and including a first bump ball configured to receive a first signal, a second bump ball configured to receive a second signal different from the first signal, and a first chip configured to receive the first and second signals through the first and second bump balls, and a second package at one side of the first package on the base board, the second package including a third bump ball configured to output the first signal, a fourth bump ball configured to output the second signal, and a second chip configured to output the first and second signals through the third and fourth bump balls, wherein the first and second bump balls are adjacent at a first side of the first package, and the third and fourth bump balls are adjacent at a third side of the second package, the third side of the second package being adjacent to the first side of the and the first package.

According to example embodiments, there is provided a semiconductor package including a base board, a first package on the base board and including a first bump ball configured to receive a first signal, a second bump ball configured to receive a second signal different from the first signal, and a first chip configured to receive the first and second signals through the first and second bump balls, and a second package at one side of the first package on the base board and including a third bump ball configured to output the first signal, a fourth bump ball configured to output the second signal, and a second chip configured to output the first and second signals through the third and fourth bump balls, wherein the first bump ball is at a first side of the first package, the second bump ball is at a second side opposite to the first side of the first package, and the third and fourth bump balls are adjacent at a third side of the second package, the third side of the second package being adjacent to the first side of the first package.

According to example embodiments, there is provided a semiconductor package including a base board, a first substrate on the base board and including a first bump ball configured to receive a first signal and a second bump ball configured to receive a second signal, a first chip on the first substrate and including a first pad configured to receive the first signal through the first bump ball, the first pad at a first side of the first chip, and a second pad configured to receive the second signal through the second bump ball, the second pad at a second side opposite to the first side of the first chip, a second substrate at one side of the first substrate on the base board and including a third bump ball configured to receive the first signal and a fourth bump ball configured to receive the second signal, and a second chip on the second substrate and including a first pin configured to output the first signal to the third bump ball, the first pin at the third side of the second chip, and a second pin configured to output the second signal to the fourth bump ball, the second pin at a fourth side opposite to the third side of the second chip, wherein the first side of the first chip and the third side of the second chip are adjacent, the first and second bump balls of the first substrate are adjacent to the first side of the second chip, and the third and fourth bump balls of the second substrate adjacent at the third side of the second chip.

According to example embodiments, there is provided a method for routing a semiconductor package including providing a base board, mounting a first package on the base board, the first package including a first bump ball configured to receive a first signal, a second bump ball configured to receive a second signal, and a first chip configured to receive the first and second signals through the first and second bump balls, and mounting a second package at one side of the first package on the base board, the second package including a third bump ball configured to output the first signal, a fourth bump ball configured to output the second signal, and a second chip configured to output the first and second signals through the third and fourth bump balls, wherein the first and second bump balls are adjacent at a first side of the first package, and the third and fourth bump balls are adjacent at a third side of the second package, which is adjacent to the first side of the first package.

BRIEF DESCRIPTION OF THE DRAWINGS

The above and other features and advantages of the example embodiments will become more apparent by describing in detail embodiments thereof with reference to the attached drawings in which.

DETAILED DESCRIPTION OF EXAMPLE EMBODIMENTS

Figure 1:
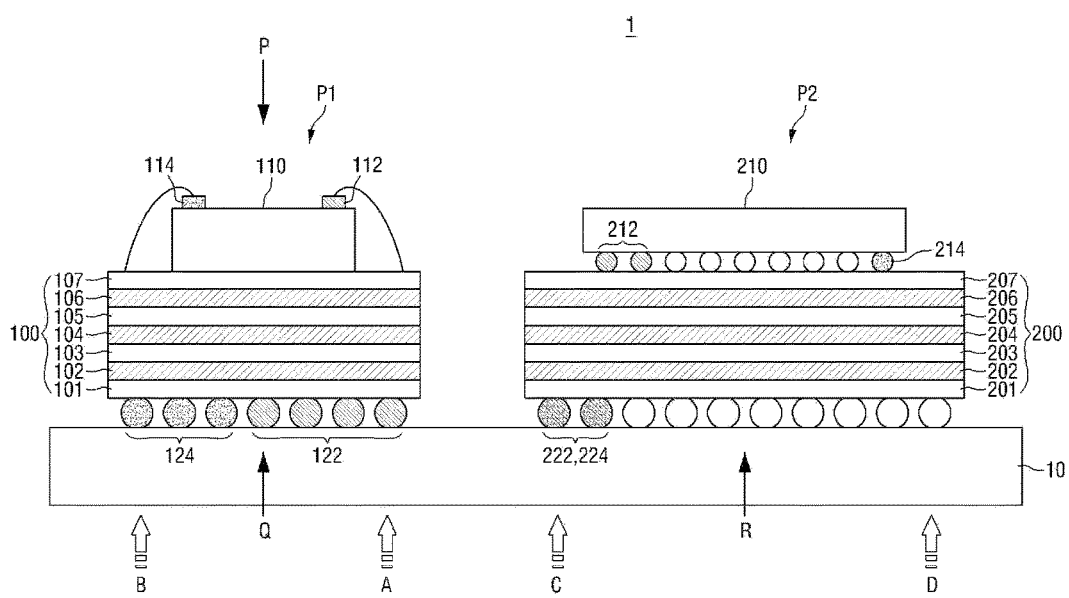
FIG. 1 is a cross-sectional view of a semiconductor package according to an example embodiment.

Advantages and features of example embodiments and methods of accomplishing the same may be understood more readily by reference to the following detailed description of preferred embodiments and the accompanying drawings. Example embodiments may, however, be embodied in many different forms and should not be construed as being limited to the embodiments set forth herein. Rather, these embodiments are provided so that this disclosure will be thorough and complete and will fully convey the concept of example embodiments to those skilled in the art, and example embodiments will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

Unless defined otherwise, all technical and scientific terms used herein have the same meaning as commonly understood by one of ordinary skill in the art to which example embodiments belong. It is noted that the use of any and all examples, or exemplary terms provided herein is intended merely to better illuminate example embodiments and is not a limitation on the scope of example embodiments unless otherwise specified. Further, unless defined otherwise, all terms defined in generally used dictionaries may not be overly interpreted.

Hereinafter, a semiconductor package according to an example embodiment will be described with reference to FIGS. 1 to 4.

Figure 2:
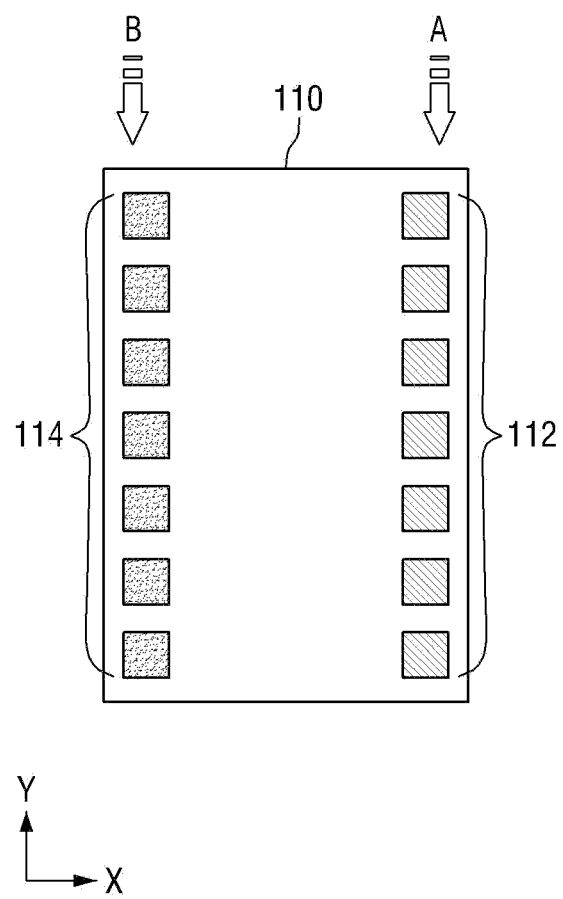
FIG. 2 is a plan view illustrating a first package of FIG. 1, viewed down in a "P" direction.
Figure 3:
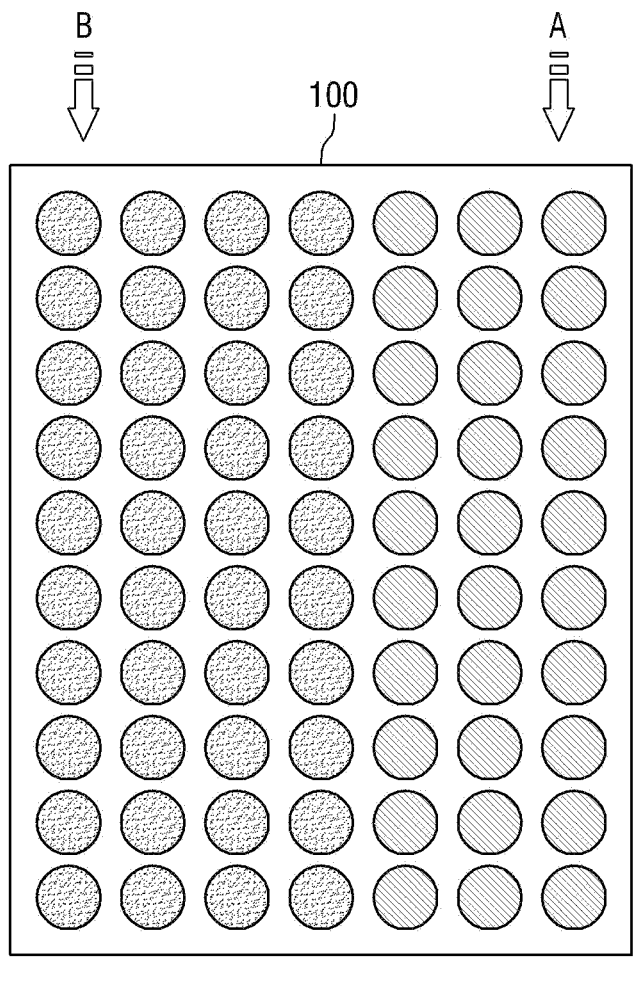
FIG. 3 is a plan view illustrating a first package of FIG. 1, viewed up in a "Q" direction.
Figure 4:
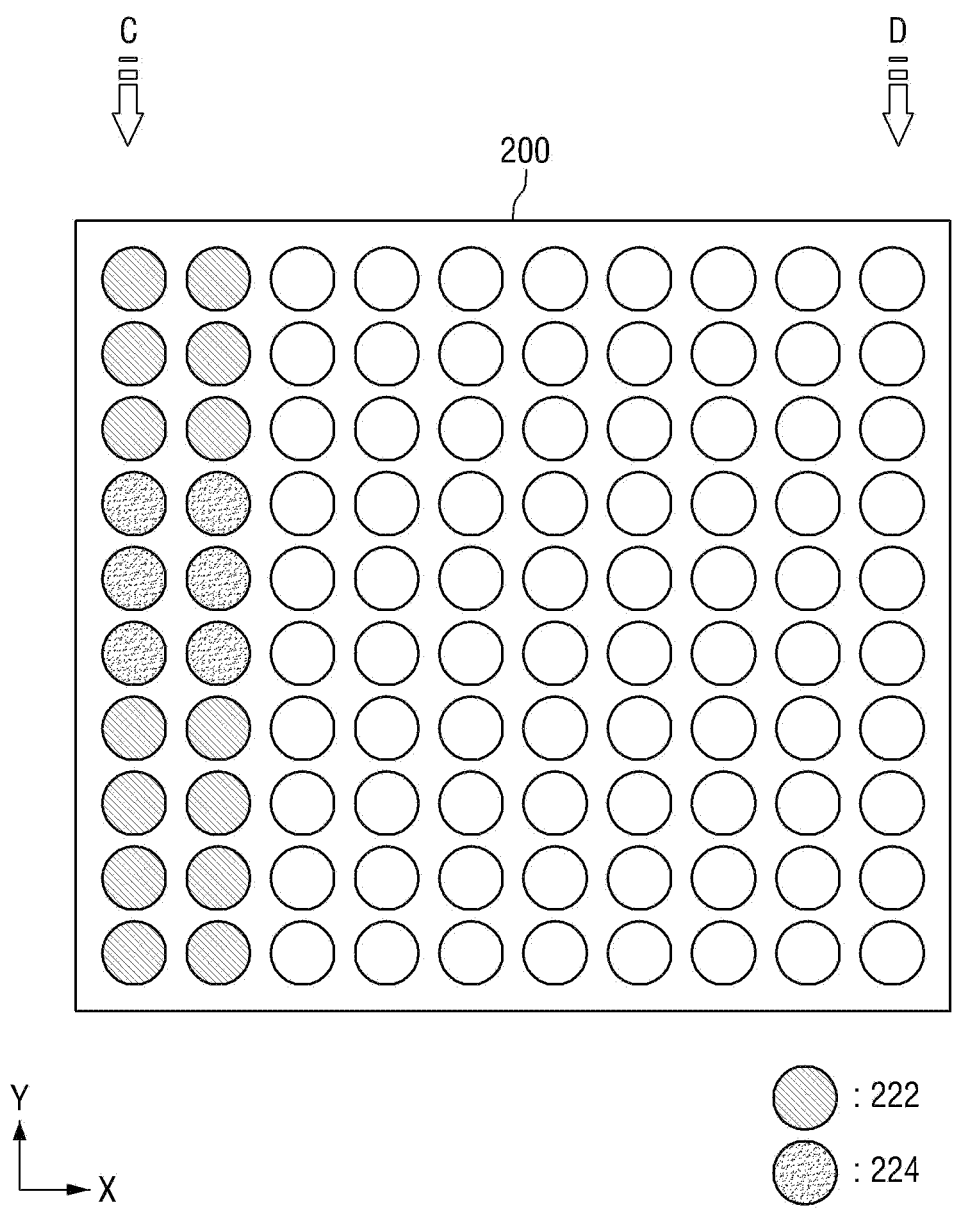
FIG. 4 is a plan view illustrating a second package of FIG. 1, viewed up in an "R" direction.

FIG. 1 is a cross-sectional view of a semiconductor package according to an example embodiment, FIG. 2 is a plan view illustrating a first package of FIG. 1, viewed down in a "P" direction, FIG. 3 is a plan view illustrating a first package of FIG. 1, viewed up in a "Q" direction and FIG. 4 is a plan view illustrating a second package of FIG. 1, viewed up in an "R" direction.

Referring to FIG. 1, the semiconductor package 1 includes a base board 10, a first package P1, and a second package P2.

As shown in FIG. 1, the first package P1 and the second package P2 may be mounted on the base board 10. The base board 10 may be a packaging substrate. For example, the base board 10 may be a printed circuit board (PCB) or a ceramic board. In some example embodiments, the base board 10 may be a set board provided in an electronic product, but example embodiments are not limited thereto.

Although not illustrated, the first package P1 and the second package P2 may be electrically connected to each other through the base board 10. That is to say, a signal output from the second package P2 may be transferred to the first package P1 through a predetermined interconnection line disposed outside or inside the base board 10, and a signal output from the first package P1 may also be transferred to the second package P2 through a predetermined interconnection line disposed outside or inside the base board 10.

The first package P1 mounted on the base board 10 may include a first substrate 100 on which a plurality of bump balls 122 and 124 are arranged, and a first chip 110 mounted on the first substrate 100.

In some example embodiments, the first chip 110 may be, for example, a memory chip. In detail, the first chip 110 may be, for example, a dynamic random access memory (DRAM) chip, but example embodiments are not limited thereto.

Referring now to FIGS. 1 and 2, a plurality of first pads 112 and a plurality of second pads 114 may be disposed on a top surface of the first chip 110. In detail, the first pads 112 may be disposed at a first side (e.g., A side) of the first chip 110 in a first direction (e.g., Y direction), and the second pads 114 may be disposed at a second side (e.g., B side) opposite to the first side (e.g., A side) in the first direction (e.g., Y direction). That is to say, the first pads 112 and the second pads 114 may be disposed to extend at opposite sides of the top surface of the first chip 110 in parallel with the first direction (e.g., Y direction). Although FIG. 2 shows that seven first pads 112 and seven second pads 114 are arranged, which is, however, provided only for illustration, various numbers of the first pads 112 and the second pads 114 may be provided.

In some example embodiments, the first pads 112 and the second pads 114 may receive different signals. That is to say, the first pads 112 may receive a first signal from the second package P2, and the second pads 114 may receive a second signal different from the first signal from the second package P2.

Here, the first signal may be, for example, a data signal, and the second signal may be at least one of a command signal and an address signal. As described above, when the first chip 110 according to an embodiment of example embodiments is a DRAM chip, the first signal may be a data (DQ) signal used in driving the DRAM chip, and the second signal may be a command and/or address (CA) signal used in driving the DRAM chip. Thus, in this case, the first pads 112 may be DQ pads and the second pads 114 may be CA pads.

Subsequently, referring to FIGS. 1 and 3, first bump balls 122 and second bump balls 124 may be disposed on the first substrate 100. In detail, the first bump balls 122 may be aligned and disposed at a first side (e.g., A side) of the first substrate 100 in a first direction (e.g., Y direction), and the second bump balls 124 may be aligned and disposed at a second side (e.g., B side) opposite to the first side (e.g., A side) in the first direction (e.g., Y direction). Meanwhile, although FIG. 3 illustrates that the first and second bump balls 122 and 124 include seven horizontal bump balls and ten vertical bump balls (70 in total), which is, however, provided only for illustration, the numbers of the first and second bump balls 122 and 124 may vary in various manners.

Here, first pads 112 of the first chip 110 and first bump balls 122 of the first substrate 100 may be electrically connected to each other, and second pads 114 of the first chip 110 and second bump balls 124 of the first substrate 100 may be electrically connected to each other. That is to say, a first signal provided from the second package P2 may be transferred to the first pad 112 of the first chip 110 through the first bump ball 122, and a second signal provided from the second package P2 may be transferred to the second pad 114 of the first chip 110 through the second bump ball 124.

FIG. 1 shows that the first chip 110 and the first substrate 100 are electrically connected to each other by wire bonding, but example embodiments are not limited thereto. The first chip 110 and the first substrate 100 may be electrically connected to each other by flip-chip bonding.

The first substrate 100 may electrically connect the first bump balls 122 to the first pads 112 or the second bump balls 124 to the second pads 114 through the interconnections 102, 104 and 106 disposed therein. That is to say, the first signal provided from the second package P2 may be transferred to the first bump balls 122 of the first substrate 100 through the base board 10, and the first signal transferred to the first bump balls 122 may then be transferred to the first pads 112 of the first chip 110 through the interconnections 102, 104 and 106 disposed on the first substrate 100. In addition, the second signal provided from the second package P2 may be transferred to the second bump balls 124 of the first substrate 100 through the base board 10, and the second signal transferred to the second bump balls 124 may then be transferred to the second pads 114 of the first chip 110 through the interconnections 102, 104 and 106 disposed on the first substrate 100.

In some example embodiments, odd numbers of the interconnections 102, 104 and 106 may be disposed on the first substrate 100. That is to say, FIG. 1 shows that three interconnections 102, 104 and 106 are provided in the first substrate 100, but example embodiments are not limited thereto. Rather, the number of interconnections may vary in various manners according to the necessity. In some other example embodiments, five or seven interconnections, for example, may be provided in the first substrate 100.

The interconnections 102, 104 and 106 may include a first conductive layer 102, a second conductive layer 104 and a third conductive layer 106. Here, the first to third conductive layers 102, 104 and 106 may be insulated from each other by first to fourth insulating layers 101, 103, 105 and 107.

In some example embodiments, the first and third conductive layers 102 and 106 may be used to electrically connect the first and second pads 112 and 114 of the first chip 110 to the first and second bump balls 122 and 124 of the first substrate 100. The second conductive layer 104 disposed between the first conductive layer 102 and the third conductive layer 106 may be used in providing a power supply voltage Vdd and a ground voltage Vss to the first and second pads 112 and 114 of the first chip 110. In such a manner, if the second conductive layer 104 disposed between the first conductive layer 102 and the third conductive layer 106 is used in providing the power supply voltage Vdd and the ground voltage Vss to the first and second pads 112 and 114 of the first chip 110, and the first and third conductive layers 102 and 106 disposed at outer parts of the second conductive layer 104 are used as routing paths for signal transfer, unnecessarily generated noise may be reduced during signal transfer, thereby improving the power integrity (PI) and signal integrity (SI) of the entire package.

Next, referring to FIGS. 1 and 4, the second package P2 may be mounted at one side of the first package P1 on the base board 10. That is to say, in some example embodiments, the semiconductor package 1 may be a discrete package on which the first package P1 and the second package P2 are mounted on the base board 10 (e.g., a set board) in a horizontal direction.

Meanwhile, FIG. 1 shows that the second package P2 is mounted at the first side (e.g., A side) of the first package P1, but example embodiments are not limited thereto. The arrangement of the first package P1 and the second package P2 may vary in various manners.

The second package P2 may include a second substrate 200 on which a plurality of bump ball 222 and 224 are arranged, and a second chip 210 mounted on the second substrate 200. In some example embodiments, the second package P2 may be a single chip package (SCP) having only the second chip 210 mounted thereon.

In some example embodiments, the second chip 210 may include various chips mountable in a system on chip (SoC) type. In detail, the second chip 210 may include various chips in the SoC type, such as a processing chip, a modem chip, or the like. In particular, in some example embodiments, in a case where the second chip 210 is a processing chip, the second chip 210 may be, for example, an application processor (AP) chip or an image signal processor (ISP) chip, but example embodiments are not limited thereto.

First pins 212 and second pins 214 may be arranged on a bottom surface of the second chip 210. In detail, the first pins 212 may be disposed at a third side (e.g., C side) of the second chip 210, and the second pin 214 may be disposed at a fourth side (e.g., D side) opposite to the third side (e.g., C side), like in the illustrated embodiment. That is to say, the first pins 212 and the second pins 214 may be separated from each other at opposite sides of the second chip 210.

In some example embodiments, the first pins 212 and the second pins 214 may output different signals. That is to say, the first pins 212 may output a first signal, and the second pins 214 may output a second signal different from the first signal.

For example, the first signal may be a data signal, and the second signal may be at least one of a command signal and an address signal. As described above, in a case where the first chip 110 according to the embodiment is a DRAM chip, the first signal may be a DQ signal used in driving the DRAM chip, and the second signal may be a CA signal used in driving the DRAM chip. Thus, in this case, the first pads 112 may be DQ pads and the second pads 114 may be CA pads.

Third bump balls 222 and fourth bump balls 224 may be disposed on the second substrate 200. As shown, a plurality of each of the third bump balls 222 and the fourth bump balls 224 may be provided. In detail, the third bump balls 222 and the fourth bump balls 224 of the second substrate 200 may be aligned at the third side (e.g., C side) in the first direction (e.g., Y direction) to be adjacent to each other. Here, the third side (e.g., C side) of the second package P2 may be adjacent to the first side (e.g., A side) of the first package P1. In other words, the first bump balls 122 disposed at the first side (e.g., A side) of the first package P1 may be connected to the third and fourth bump balls 222 and 224 disposed at the third side (e.g., C side) of the second package P2 through the base board 10 with minimum distances.

In some example embodiments, the fourth bump balls 224 may be disposed between the third bump balls 222, as shown. In detail, the fourth bump balls 224 may be aligned and disposed at the third side (e.g., C side) of the second substrate 200 in the first direction (e.g., Y direction), specifically, in the central portion of the second substrate 200. In addition, the third bump balls 222 may also be aligned and disposed at the third side (e.g., C side) of the second substrate 200 in the first direction (e.g., Y direction), specifically above and below the fourth bump balls 224.

Meanwhile, although FIG. 4 illustrates that the third and fourth bump balls 222 and 224 include 10 horizontal bump balls and 10 vertical bump balls (100 in total), which is, however, provided only for illustration, the numbers of the third and fourth bump balls 222 and 224 may vary in various manners.

Here, the first pads 212 of the second chip 210 and the first bump balls 222 of the second substrate 200 may be electrically connected to each other, and the second pads 214 of the second chip 210 and the second bump balls 224 of the second substrate 200 may be electrically connected to each other. That is to say, a first signal output from the first pins 212 may be routed through the second substrate 200 to then be output through the third bump balls 222 adjacent to the first package P1, and a second signal output from the second pin 214 may be routed through the second substrate 200 to then be output through the fourth bump balls 224 adjacent to the first package P1.

FIG. 1 shows that the second chip 210 and the second substrate 200 are electrically connected to each other by flip-chip bonding, but example embodiments are not limited thereto. The second chip 210 and the second substrate 200 may be electrically connected to each other by wire bonding.

The second substrate 200 may electrically connect the third bump balls 222 to the first pins 212 or the fourth bump balls 224 to the second pins 214 through the interconnections 202, 204 and 206 disposed therein. That is to say, the first signal output from the second chip 210 may be routed through the interconnections 202, 204 and 206 disposed on the second substrate 200 to then be transferred to the third bump balls 222 adjacent to the first package P1, and the second signal output from the second chip 210 may be routed through the interconnections 202, 204 and 206 disposed on the second substrate 200 to then be transferred to the fourth bump balls 224 adjacent to the first package P1.

Meanwhile, in some example embodiments, odd numbers of the interconnections 202, 204 and 206 may also be disposed on the second substrate 200, like on the first substrate 100. That is to say, FIG. 1 shows that three interconnections 202, 204 and 206 are provided in the second substrate 200, but example embodiments are not limited thereto. Rather, the number of interconnections may vary in various manners according to the necessity. For example, in some other example embodiments, five or seven interconnections may be provided in the second substrate 200.

The interconnections 202, 204 and 206 may include a fourth conductive layer 202, a fifth conductive layer 204 and a sixth conductive layer 206. Here, the fourth to sixth conductive layers 202, 204 and 206 may be insulated from each other by fifth to eighth insulating layers 201, 203, 205 and 207.

In some example embodiments, the fourth and sixth conductive layers 202 and 206 may be used to electrically connect the first and second pins 212 and 214 of the second chip 210 to the third and fourth bump balls 222 and 224 of the second substrate 200. In particular, as described above, the second pins 214 of the second chip 210 may be disposed at a fourth side (e.g., D side) of the second package P2 but may be routed through the fourth and sixth conductive layers 202 and 206 disposed on the second substrate 200 to then be electrically connected to the fourth bump balls 224 adjacent to the first package P1.

Meanwhile, the fifth conductive layer 204 disposed between the fourth conductive layer 202 and the sixth conductive layer 206 may be used to provide a power supply voltage Vdd and a ground voltage Vss to the first and second pins 212 and 214 of the second chip 210. In such a manner, if the fifth conductive layer 204 disposed between the fourth conductive layer 202 and the sixth conductive layer 206 is used to provide a power supply voltage Vdd and a ground voltage Vss to the first and second pins 212 and 214 of the second chip 210, and the fourth and sixth conductive layers 202 and 206 disposed at outer parts of the fifth conductive layer 204 are used as routing paths for signal transfer, unnecessarily generated noise may be reduced during signal transfer, thereby improving the power integrity (PI) and signal integrity (SI) of the entire package like the first package P1.

As described above, in the semiconductor package 1 according to an example embodiment, for example, the first pads 112 used as DQ pads are disposed at the first side (e.g., A side) of the first chip 110, the second pads 114 used as CA pads is disposed at the second side (e.g., B side) of the first chip 110, the first pins 212 used as a DQ pin is disposed at the third side (e.g., C side) of the second chip 210, which is adjacent to the first side (e.g., A side) of the first chip 110, and the second pins 214 used as a CA pin is disposed at the fourth side (e.g., B side) of the second chip 210, which is far from the first side (e.g., A side) of the first chip 110.

However, in the semiconductor package 1 according to an example embodiment, the first pins 212 and the second pins 214 are routed through the interconnections 202, 204 and 206 disposed on the second substrate 200 to then be electrically connected to the third and fourth bump balls 222 and 224, so that they are connected to the first and second bump balls 122 and 124 of the first package P1 through the base board 10 with minimum distances. That is to say, in the semiconductor package 1 according to an example embodiment, when the first package P1 and the second package P2 are configured as discrete packages horizontally mounted on the base board 10 (e.g., a set board), a minimum routing distance can be secured, thereby preventing the signal integrity (SI) and power integrity (PI) of the entire package and preventing unnecessary noises from being generated during signal transfer. Accordingly, the performance and reliability of the semiconductor package 1 can be improved.

Next, a second package of a semiconductor package according to an example embodiment will be described with reference to FIG. 5.

Figure 5:
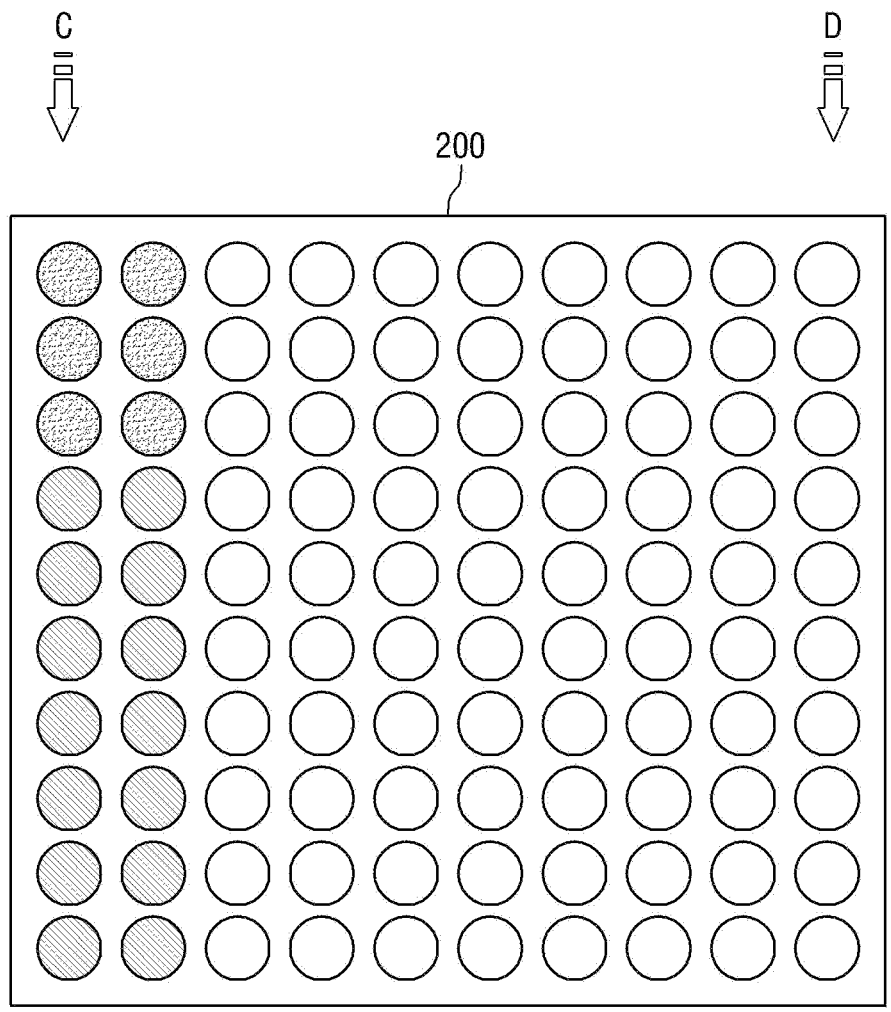
FIG. 5 is a plan view illustrating a second package of a semiconductor package according to an example embodiment, viewed up in the "R" direction of FIG. 1.

FIG. 5 is a plan view illustrating a second package of a semiconductor package according to an example embodiment, viewed up in the "R" direction of FIG. 1. The following description will focus on differences between the previous and present example embodiments and repeated explanations will be omitted.

Referring now to FIG. 5, a plurality of third bump balls 222 and a plurality of fourth bump balls 224 may be disposed on a second substrate 200 of the semiconductor package 2. In addition, as shown in FIG. 5, the third bump balls 222 and the fourth bump balls 224 of the second substrate 200 may be aligned at a third side (e.g., C side) in a first direction (e.g., Y direction) to be adjacent to each other. Here, the third side (e.g., C side) of a second package P2 may be adjacent to a first side (e.g., A side) of a first package P1. In other words, the first bump balls 122 disposed at the first side (e.g., A side) of the first package P1 may be connected to the third and fourth bump balls 222 and 224 disposed at the third side (e.g., C side) of the second package P2 through a base board 10 with minimum distances.

As shown in FIG. 5, the fourth bump balls 224 may be disposed above the third bump balls 222. In detail, the fourth bump balls 224 may be aligned at the third side (e.g., C side) of the second substrate 200 in the first direction (e.g., Y direction), specifically, above the third bump balls 224. As described above, if the fourth bump balls 224 are collected and disposed at an upper side of the second substrate 200, a routing structure is simplified, thereby preventing unnecessary noises from being generated during signal transfer.

Next, a second package of a semiconductor package according to an example embodiment will be described with reference to FIG. 6.

Figure 6:
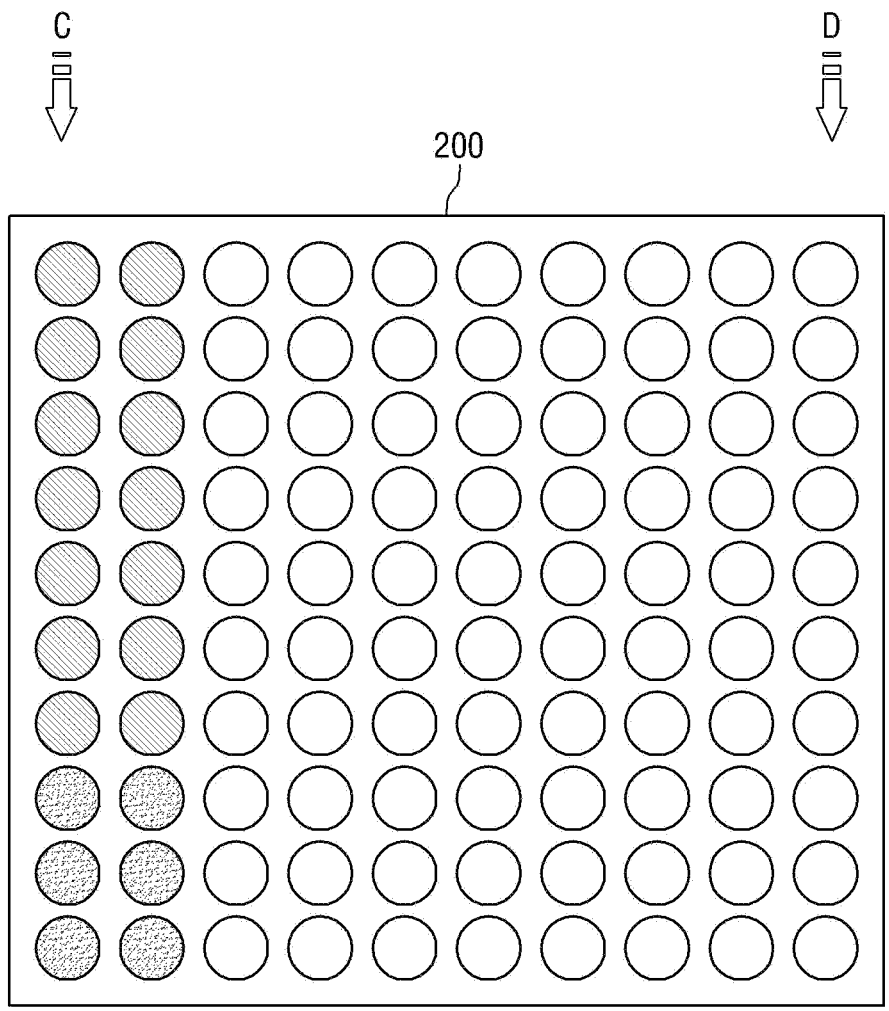
FIG. 6 is a plan view illustrating a second package of a semiconductor package according to an example embodiment, viewed up in the "R" direction of FIG. 1.
Figure 6:
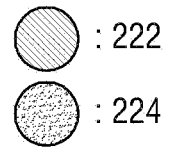

FIG. 6 is a plan view illustrating a second package of a semiconductor package according to an example embodiment, viewed up in the "R" direction of FIG. 1. The following description will focus on differences between the previous and present embodiments of example embodiments and repeated explanations will be omitted.

Referring to FIG. 6, a plurality of third bump balls 222 and a plurality of fourth bump balls 224 may be disposed on a second substrate 200 of the semiconductor package 3. In addition, as shown in FIG. 6, the third bump balls 222 and the fourth bump balls 224 of the second substrate 200 may be aligned at a third side (e.g., C side) in a first direction (e.g., Y direction) to be adjacent to each other. Here, the third side (e.g., C side) of a second package P2 may be adjacent to the first side (e.g., A side) of a first package P1. In other words, the first bump balls 122 disposed at a first side (e.g., A side) of the first package P1 may be connected to the third and fourth bump balls 222 and 224 disposed at the third side (e.g., C side) of the second package P2 through a base board 10 with minimum distances.

As shown in FIG. 6, the fourth bump balls 224 may be disposed below the third bump balls 222. In detail, the fourth bump balls 224 may be aligned at the third side (e.g., C side) of the second substrate 200 in the first direction (e.g., Y direction), specifically, below the third bump balls 224. As described above, if the fourth bump balls 224 are collected and disposed at a lower side of the second substrate 200, a routing structure is simplified, thereby preventing unnecessary noises from being generated during signal transfer.

Next, a second package of a semiconductor package according to an example embodiment will be described with reference to FIG. 7.

Figure 7:
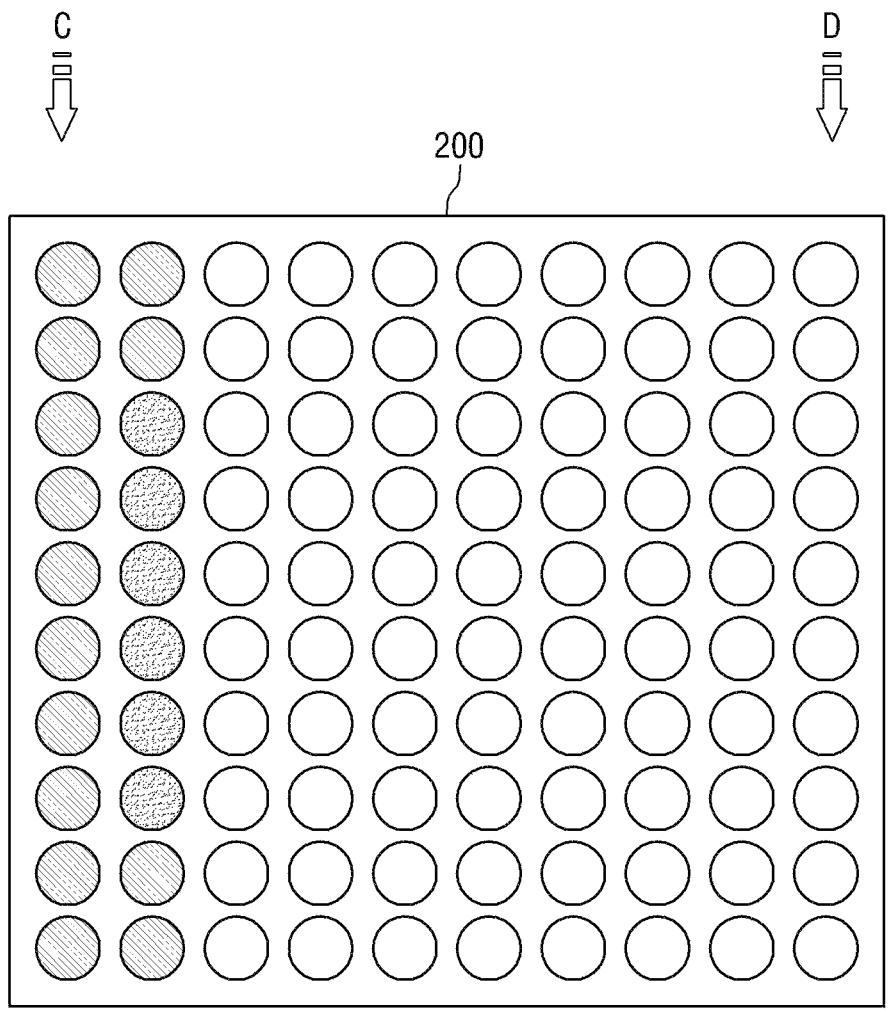
FIG. 7 is a plan view illustrating a second package of a semiconductor package according to an example embodiment, viewed up in the "R" direction of FIG. 1.
Figure 7:
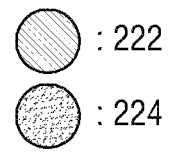

FIG. 7 is a plan view illustrating a second package of a semiconductor package according to an example embodiment, viewed up in the "R" direction of FIG. 1. The following description will focus on differences between the previous and present example embodiments and repeated explanations will be omitted.

Referring to FIG. 7, a plurality of third bump balls 222 and a plurality of fourth bump balls 224 may be disposed on a second substrate 200 of the semiconductor package 4. In addition, as shown in FIG. 7, the third bump balls 222 and the fourth bump balls 224 of the second substrate 200 may be aligned at a third side (e.g., C side) in a first direction (e.g., Y direction) to be adjacent to each other. Here, the third side (e.g., C side) of a second package P2 may be adjacent to a first side (e.g., A side) of a first package P1. In other words, the first bump ball 122 disposed at the first side (e.g., A side) of the first package P1 may be connected to the third and fourth bump balls 222 and 224 disposed at the third side (e.g., C side) of the second package P2 through a base board 10 with minimum distances.

As shown in FIG. 7, the fourth bump balls 224 may be disposed between the third bump balls 222 to extend in a line in the first direction (e.g., Y direction). A routing structure is simplified by the arrangement of the fourth bump balls 224, as shown in FIG. 4, according to the interconnection configuration of the base board 10, thereby preventing unnecessary noises from being generated during signal transfer.

Next, a semiconductor package according to an example embodiment will be described with reference to FIGS. 8 and 9.

Figure 8:
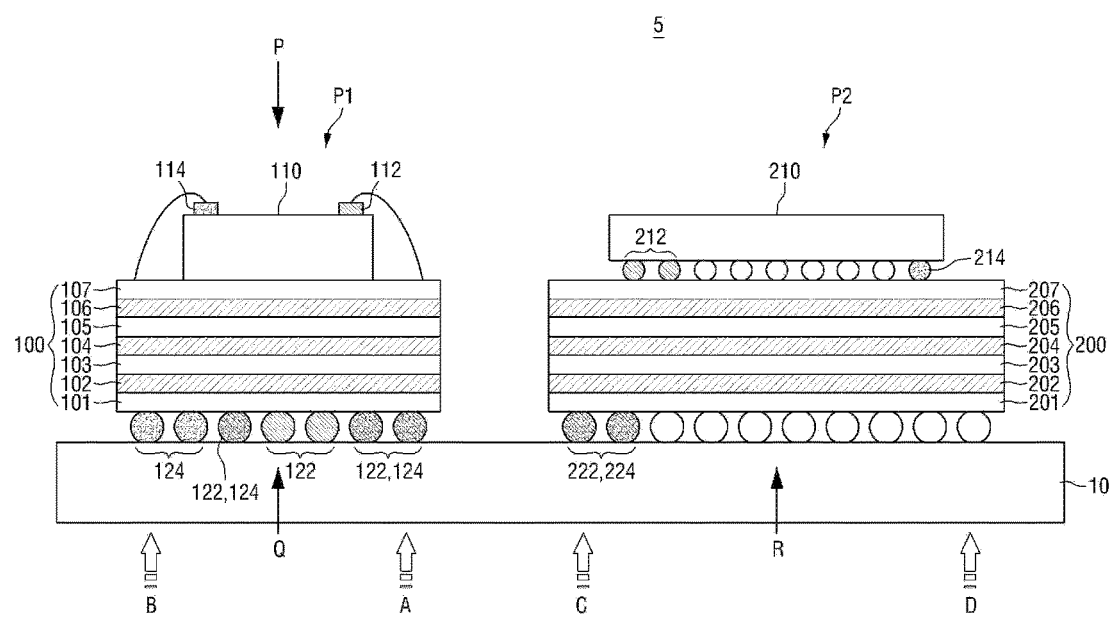
FIG. 8 is a cross-sectional view of a semiconductor package according to an example embodiment.
Figure 9:
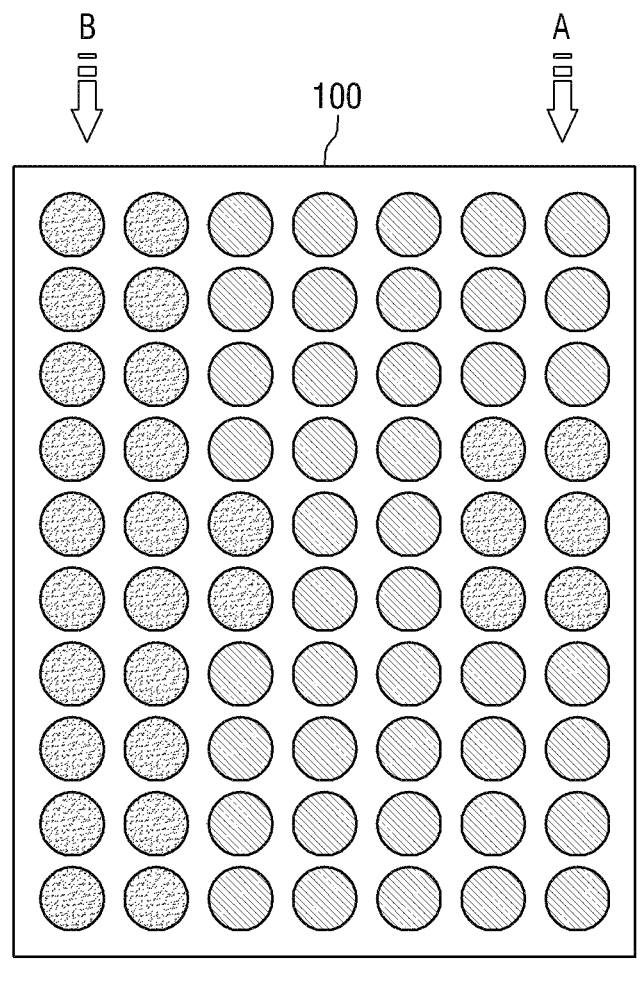
FIG. 9 is a plan view illustrating a first package of FIG. 8, viewed up in a "Q" direction.
Figure 9:
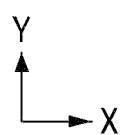
Figure 9:
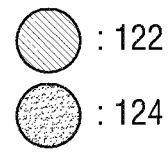

FIG. 8 is a conceptual cross-sectional view of a semiconductor package according to an example embodiment and FIG. 9 is a plan view illustrating a first package of FIG. 8, viewed up in a "Q" direction. The following description will focus on differences between the previous and present example embodiments and repeated explanations will be omitted.

Referring to FIGS. 8 and 9, a plurality of first bump balls 122 and a plurality of second bump balls 124 may be disposed on a first substrate 100 of the semiconductor package 5 to be adjacent to a first side (e.g., A side) of the first substrate 100. In detail, as shown in FIGS. 8 and 9, some of the first bump balls 122 and some of the second bump balls 124 may be aligned at the first side (e.g., A side) of the first substrate 100 in a first direction (e.g., Y direction), and the remaining second bump balls 124 may be aligned at a second side (e.g., B side) opposite to the first side (e.g., A side) of the first substrate 100 in the first direction (e.g., Y direction).

Here, the arrangement of the third and fourth bump balls 222 and 224 of the second package P2 may be the same as that in one of the aforementioned semiconductor packages 1 to 4.

In such a manner, if some of the second bump balls 124 are arranged at the first side (e.g., A side) of the first substrate 100, the second bump balls 124 of the first package P1 and the fourth bump balls 224 of the second package P2 are connected to each other with reduced lengths. Therefore, routing lengths of the semiconductor package 5 can be minimized, thereby preventing unnecessary noises from being generated during signal transfer.

Next, a semiconductor package according to an example embodiment will be described with reference to FIG. 10.

Figure 10:
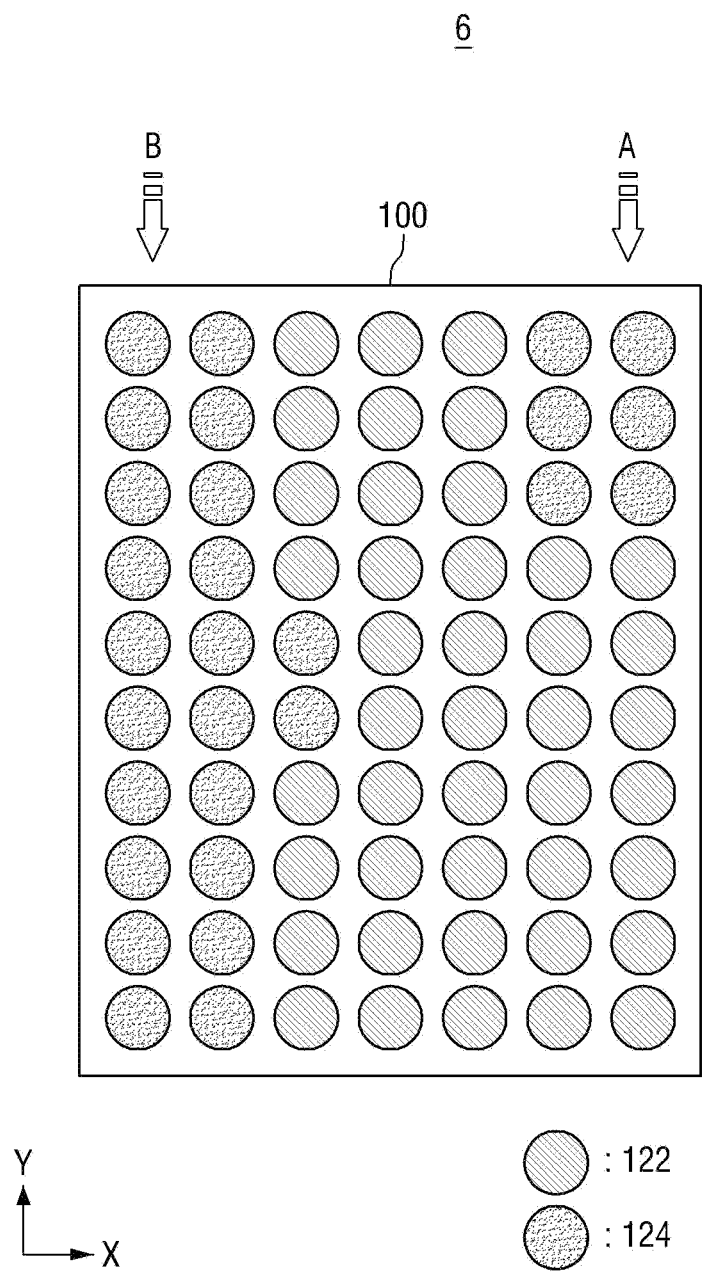
FIG. 10 is a plan view illustrating a first package of a semiconductor package according to an example embodiment, viewed up in the "Q" direction of FIG. 8.

FIG. 10 is a plan view illustrating a first package of a semiconductor package according to an example embodiment, viewed up in the "Q" direction of FIG. 8. The following description will focus on differences between the previous and present example embodiments and repeated explanations will be omitted.

Referring to FIG. 10, a plurality of first bump balls 122 and a plurality of second bump balls 124 may be disposed on a first substrate 100 of the semiconductor package 6 to be adjacent to a first side (e.g., A side) of the first substrate 100. In detail, as shown in FIG. 10, some of the first bump balls 122 and some of the second bump balls 124 may be aligned at the first side (e.g., A side) of the first substrate 100 in a first direction (e.g., Y direction). Specifically, some of the second bump balls 124 may be disposed above the first bump balls 122. Meanwhile, the remaining second bump balls 124 may be aligned at a second side (e.g., B side) opposite to the first side (e.g., A side) of the first substrate 100 in the first direction (e.g., Y direction).

Here, the arrangement of third and fourth bump balls 222 and 224 of a second package P2 may be the same as that in one of the aforementioned semiconductor packages 1 to 4.

In such a manner, if some of the second bump balls 124 are collected and arranged at the first side (e.g., A side) of the first substrate 100, the second bump balls 124 of the first package P1 and the fourth bump balls 224 of the second package P2 are connected to each other with reduced lengths. Therefore, routing lengths of the semiconductor package 6 can be minimized, thereby preventing unnecessary noises from being generated during signal transfer.

Figure 11:
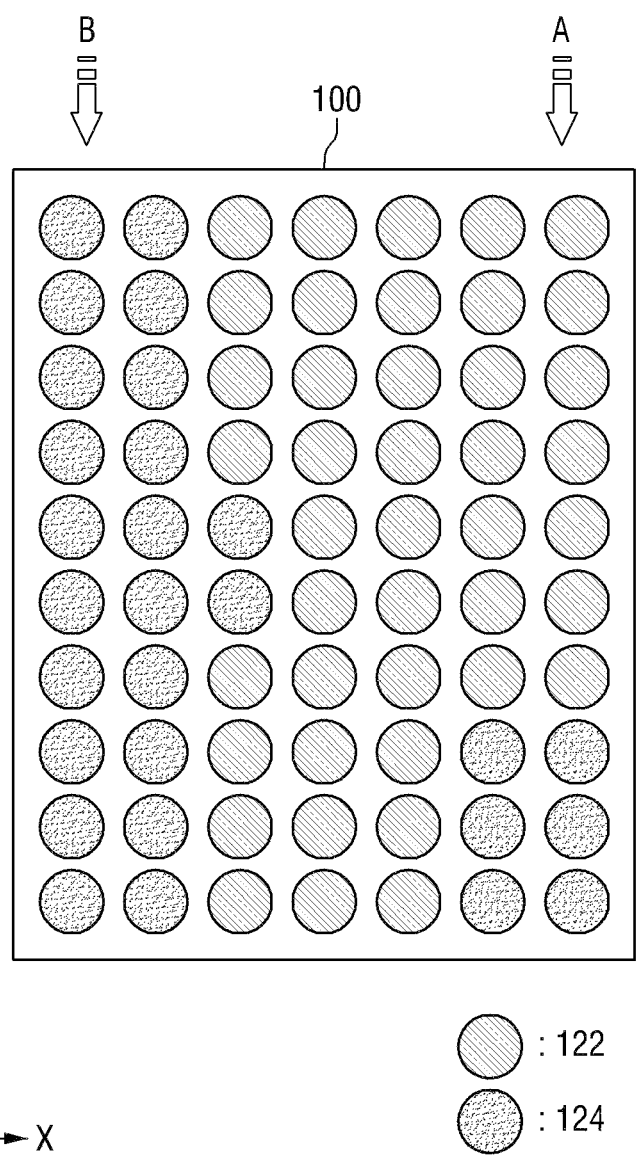
FIG. 11 is a plan view illustrating a first package of a semiconductor package according to an example embodiment, viewed up in the "Q" direction of FIG. 8.

Next, a semiconductor package according to an example embodiment will be described with reference to FIG. 11. FIG. 11 is a plan view illustrating a first package of a semiconductor package according to an example embodiment, viewed up in the "Q" direction of FIG. 8. The following description will focus on differences between the previous and present example embodiments and repeated explanations will be omitted.

Referring to FIG. 11, a plurality of first bump balls 122 and a plurality of second bump balls 124 may be disposed on a first substrate 100 of the semiconductor package 7 to be adjacent to a first side (e.g., A side) of the first substrate 100. In detail, as shown in FIG. 11, some of the first bump balls 122 and some of the second bump balls 124 may be aligned at the first side (e.g., A side) of the first substrate 100 in a first direction (e.g., Y direction). Specifically, some of the second bump balls 124 may be disposed below the first bump balls 122. Meanwhile, the remaining second bump balls 124 may be aligned at a second side (e.g., B side) opposite to the first side (e.g., A side) of the first substrate 100 in the first direction (e.g., Y direction).

Here, the arrangement of third and fourth bump balls 222 and 224 of a second package P2 may be the same as that in one of the aforementioned semiconductor packages 1 to 4.

In such a manner, if some of the second bump balls 124 are collected and arranged at a lower side of the first substrate 100, a routing structure is simplified by the arrangement, thereby preventing unnecessary noises from being generated during signal transfer.

Next, an electronic system to which a semiconductor device according to some example embodiments is applied and an application example thereof will be described with reference to FIGS. 12 to 15.

Figure 12:
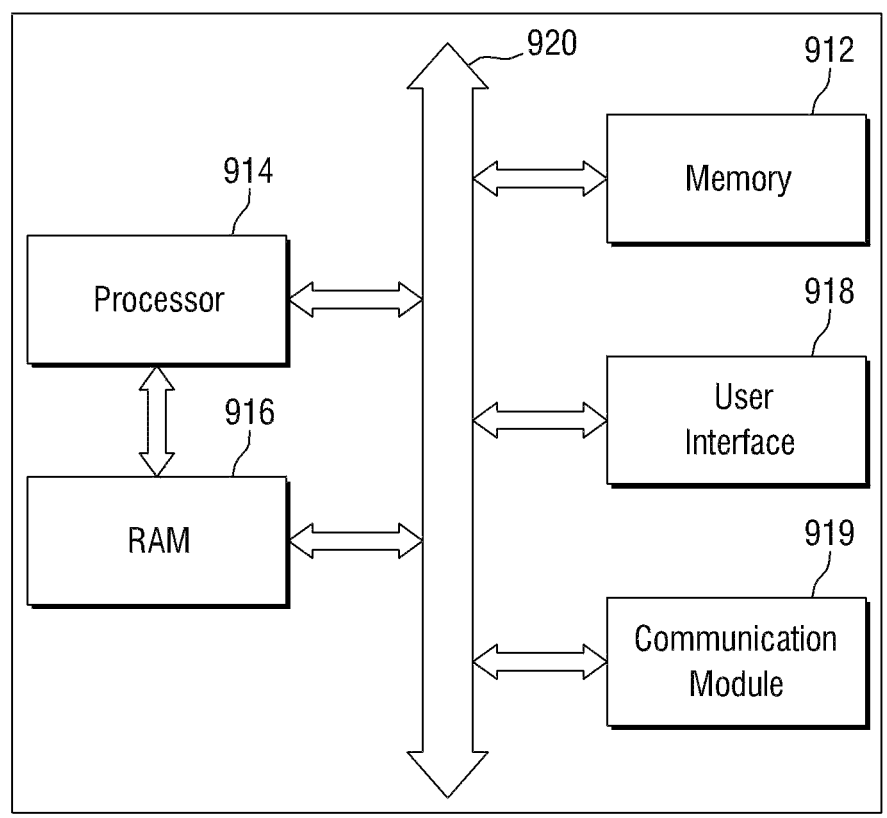
FIG. 12 is a block diagram of an electronic system incorporating a semiconductor device according to some example embodiments.
Figure 13:
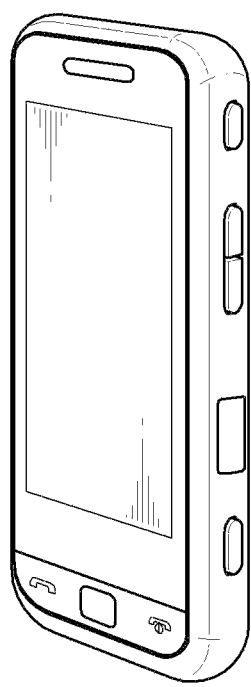
FIGS. 13 to 15 illustrate exemplary electronic devices to which the electronic system shown in FIG. 12 can be applied.
Figure 14:
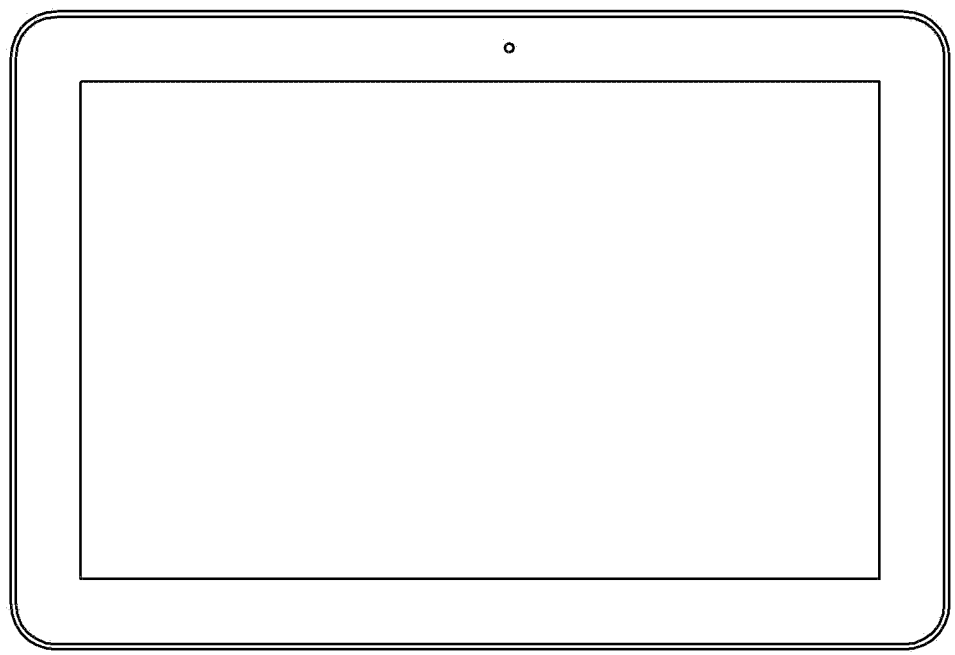
Figure 15:
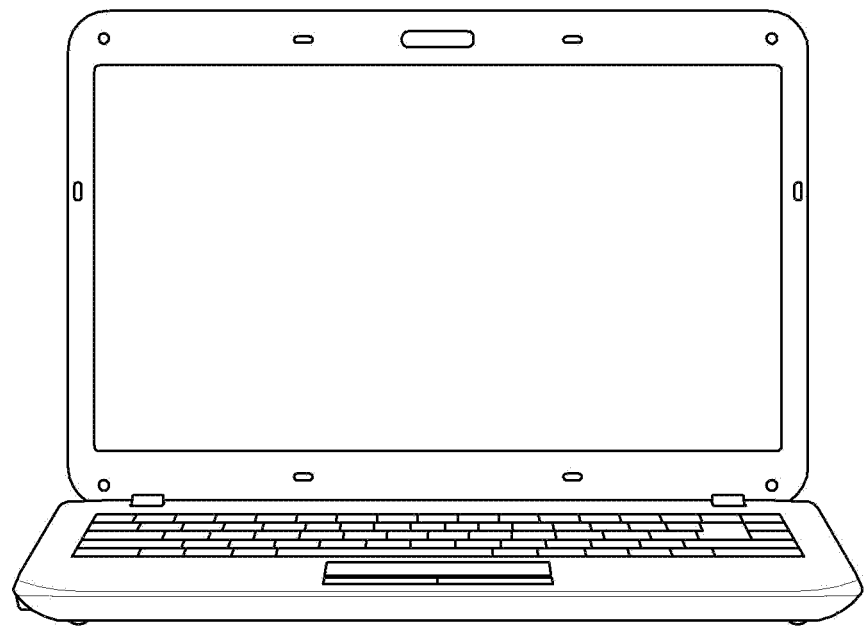

FIG. 12 is a block diagram of an electronic system incorporating a semiconductor device according to some example embodiments, and FIGS. 13 to 15 illustrate exemplary electronic devices to which the electronic system shown in FIG. 12 can be applied.

Referring to FIG. 12, the electronic system 900 may include a memory system 912, a processor 914, a RAM 916, a user interface 918, and a communication module 919, which may perform data communication through a bus 920.

The processor 914 may execute a program and may control the electronic system 900. In addition, the RAM 916 may be used as the operating memory of the processor 914. Meanwhile, in some example embodiments, the processor 914 and the RAM 916 may be mounted in the form of a discrete package on a set board. In this case, the processor 914 and the RAM 916 may be mounted in the form of one of the semiconductor packages 1 to 7.

The user interface 918 may be used in inputting or outputting data to or from the electronic system 900.

The memory system 912 may store codes for operation of the processor 914, data processed by the processor 914 and externally input data. The memory system 912 may include a controller and a memory device. The controller may be connected to the bus 920 and the memory device. The controller may be configured to driving firmware for controlling the memory device.

As an example, the controller may further include well known components, including an internal RAM, an internal processing unit, a host interface, and a memory interface.

Here, the internal RAM may be used as the operating memory of the processing unit. The processing unit may control the overall operation of the controller.

The host interface includes a protocol for data exchange between a bus 920 and the controller. For example, the controller may be configured to communicate with an external device (host) through one of various standardized interface protocols such as Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), Small Computer Small Interface (SCSI), Enhanced Small Disk Interface (ESDI), and Integrated Drive Electronics (IDE). The memory interface is configured to interface with the memory device. For example, the memory interface includes NAND interface or a NOR interface.

The memory system 912 may be configured to additionally include an error correction block. The error correction block may be configured to detect an error of data read from a memory device and to correct the detected error using an error correction code (ECC).

Meanwhile, the controller and the memory device may be integrated into a single semiconductor device. As an example, the controller and the memory device may be integrated as one semiconductor device to configure a memory card. For example, the controller and the memory device may be integrated as one semiconductor device to configure a PC card (for example, PCMCIA), a compact flash card (CF), a smart media card (SM/SMC), a memory stick, a multimedia card (for example, MMC, RS-MMC and MMCmicro), an SD card (for example, SD, miniSD and microSD), and a universal flash memory device (for example, UFS).

The memory system 912 may be mounted in various types of packages. Examples of the packages of the memory system 912 may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Substrate (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

The communication module 919 may communicate with the memory system 912, the processor 914, the RAM 916 and the user interface 918 through the bus 920. In addition, the communication module 919 may include the semiconductor package according to some example embodiments.

The electronic system 900 may be applied to electronic control devices of a variety of electronic devices. FIG. 13 illustrates an example in which an electronic system (900 of FIG. 12) is applied to a mobile phone (1000), FIG. 14 illustrates an example in which an electronic system (900 of FIG. 12) is applied to a tablet PC, and FIG. 15 illustrates an example in which an electronic system (900 of FIG. 12) is applied to a notebook computer. In addition, it is obvious to one skilled in the art that the electronic system (900 of FIG. 12) can be applied to various applications including a personal digital assistant (PDA), a digital music player, a memory card, a mobile terminal having mobile communication capability.

While example embodiments has been particularly shown and described with reference to exemplary embodiments thereof, it will be understood by those of ordinary skill in the art that various changes in form and details may be made therein without departing from the spirit and scope of example embodiments as defined by the following claims. It is therefore desired that example embodiments be considered in all respects as illustrative and not restrictive, reference being made to the appended claims rather than the foregoing description to indicate the scope of example embodiments.

What is claimed is:

1. A semiconductor package comprising:
a chip including a first pin at a first side of the chip to output a first signal, and a second pin at a second side of the chip to output a second signal different from the first signal, the first side of the chip and the second side of the chip being opposite sides of the chip;
a substrate having the chip thereon, the substrate including a first bump ball electrically connected to the first pin and a second bump ball electrically connected to the second pin; and
a dynamic random access memory (DRAM) having a data (DQ) pad and at least one of a command and address (CA) pad,
wherein the first bump ball and the second bump ball are adjacent at one of first and second sides of the substrate, and
the substrate includes,
first to third conductive layers sequentially stacked, the first and third conductive layers are configured to electrically connect the first and second pins to the first and second bump balls, respectively, the second conductive layer is configured to provide a power supply voltage and a ground voltage to the first and second pins, and the second conductive layer is between the first and third conductive layers, and
first and second insulating layers, the first insulating layer being between the first and second conductive layers and the second insulating layer being between the second and third conductive layers, wherein the first signal includes a data signal, and the second signal includes at least one of a command signal and an address signal, and
the first pin is electrically connected to the DQ pad of the DRAM, and the second pin is electrically connected to the CA pad of the DRAM.

2. The semiconductor package of claim 1, wherein a plurality of bump balls of each of the first and second bump balls are on the substrate, and the plurality of second bump balls are between the plurality of first bump balls.

3. The semiconductor package of claim 1, wherein a plurality of bump balls of each of the first and second bump balls are on the substrate, the plurality of second bump balls are above the substrate, and the plurality of first bump balls are below the substrate.

4. A semiconductor package comprising:
a base board;
a first package on the base board, the first package including a first plurality of bump balls, the first plurality of bump balls including a first bump ball configured to receive a first signal and a second bump ball configured to receive a second signal different from the first signal, the first package further including a first chip configured to receive the first and second signals through the first and second bump balls; and
a second package at one side of the first package on the base board, the second package including a second plurality of bump balls, the second plurality of bump balls including a third bump ball configured to output the first signal and a fourth bump ball configured to output the second signal, the second package further including a second chip configured to output the first and second signals through the third and fourth bump balls,
wherein the first and second bump balls are adjacent at a first side of the first package, the third and fourth bump balls are adjacent at a third side of the second package, the third side of the second package being adjacent to the first side of the first package, the first and second bump balls are in an outermost row of the first plurality of bump balls at the first side of the first package such that no bump balls exist between the outermost row of the first plurality of bump balls at the first side of the first package and the first side of the first package, and the third and fourth bump balls are in an outermost row of the second plurality of bump balls at the third side of the second package such that no bump balls exist between the outermost row of the second plurality of bump balls at the third side of the second package and the third side of the second package,
wherein a first pad is configured to receive the first signal through the first bump ball and is at a first side of the first chip, and a second pad is configured to receive the second signal through the second bump ball and is at a second side of the first chip opposite to the first side of the first chip, and
wherein the first pad includes a data (DQ) pad, and the second pad includes an at least one of command and address (CA) pad.

5. The semiconductor package of claim 4, wherein the first signal includes a data signal, and the second signal includes at least one of a command signal and an address signal.

6. The semiconductor package of claim 4, wherein the first chip includes a memory chip, and the second chip includes a chip configured in a system on chip (SoC) type.

7. The semiconductor package of claim 6, wherein the memory chip includes a dynamic random access memory (DRAM) chip, and the chip configured in the SoC type includes a processing chip including an application processor (AP) chip and an image signal processor (ISP) chip, and a modem chip.

8. The semiconductor package of claim 7, wherein the second package is a single chip package having only the chip configured in the SoC type.

9. The semiconductor package of claim 4, wherein a first pin is configured to output the first signal to the third bump ball and is at a third side of the second chip, and a second pin is configured to output the second signal to the fourth bump ball and is at a fourth side of the second chip opposite to the third side of the second chip.

10. The semiconductor package of claim 4, wherein a plurality of each of the first and second bump balls are at the first package, a plurality of each of the third and fourth bump balls are at the second package, the plurality of first bump balls face the plurality of third bump balls.

11. The semiconductor package of claim 10, wherein the plurality of second bump balls are between the plurality of first bump balls, and the plurality of fourth bump balls are between the plurality of third bump balls.

12. A semiconductor package comprising:
a base board;
a first package on the base board, the first package including a first plurality of bump balls including a first bump ball configured to receive a first signal and a second bump ball configured to receive a second signal different from the first signal, and the first package further including a first chip configured to receive the first and second signals through the first and second bump balls; and
a second package at one side of the first package on the base board, the second package including a second plurality of bump balls including a third bump ball configured to output the first signal and a fourth bump ball configured to output the second signal, and the second package further including a second chip configured to output the first and second signals through the third and fourth bump balls,
wherein the first bump ball is at a first side of the first package, the second bump ball is at a second side of the first package opposite to the first side of the first package, and the third and fourth bump balls are adjacent at a third side of the second package, the third side of the second package being adjacent to the first side of the first package, the first bump ball is in an outermost row of the first plurality of bump balls at the first side of the first package such that no bump balls exist between the outermost row of the first plurality of bump balls at the first side of the first package and the first side of the first package, and the third and fourth bump balls are in an outermost row of the second plurality of bump balls at the third side of the second package such that no bump balls exist between the outermost row of the second plurality of bump balls at the third side of the second package and the third side of the second package,
wherein a first pad is configured to receive the first signal through the first bump ball and is at a first side of the first chip, and a second pad is configured to receive the second signal through the second bump ball and is at a second side of the first chip opposite to the first side of the first chip, and
wherein the first pad includes a data (DQ) pad, and the second pad includes an at least one of command and address (CA) pad.

13. The semiconductor package of claim 12, wherein a first pin configured to output the first signal to the third bump ball is at the third side of the second chip, and a second pin configured to output the second signal to the fourth bump ball is at a fourth side of the second chip opposite to the third side of the second chip.

14. A semiconductor package comprising:
a base board;
a first substrate on the base board, the first substrate including a first plurality of bump balls including a first bump ball configured to receive a first signal and a second bump ball configured to receive a second signal;
a first chip on the first substrate and including a first pad configured to receive the first signal through the first bump ball, the first pad at first side of the first chip, and a second pad configured to receive the second signal through the second bump ball, the second pad at a second side opposite to the first side of the first chip;
a second substrate at one side of the first substrate on the base board, the second substrate including a second plurality of bump balls including a third bump ball configured to receive the first signal and a fourth bump ball configured to receive the second signal; and
a second chip on the second substrate and including a first pin configured to output the first signal to the third bump ball, the first pin at a third side of the second chip, and a second pin configured to output the second signal to the fourth bump ball, the second pin at a fourth side opposite to the third side of the second chip, wherein the first side of the first chip and the third side of the second chip are adjacent, the first and second bump balls of the first substrate are in an outermost row of the first plurality of bump balls at a first edge of the first substrate such that no bump balls exist between the outermost row of the first plurality of bump balls at the first edge of the first substrate and the first edge of the first substrate, and the third and fourth bump balls of the second substrate are in an outermost row of the second plurality of bump balls at a second edge of the second substrate such that no bump balls exist between the outermost row of the second plurality of bump balls at the second edge of the second substrate and the second edge of the second substrate, the first side of the first chip is adjacent to the first edge of the first substrate, and the third side of the second chip is adjacent to the second edge of the second substrate, wherein the first pad includes a data (DQ) pad, the second pad includes an at least one of command and address (CA) pad, the first pin includes a DQ pin, and the second pin includes a CA pin.

15. The semiconductor package of claim 14, wherein the first signal includes a data signal, and the second signal includes at least one of a command signal and an address signal.

16. The semiconductor package of claim 14, wherein the first chip includes a memory chip, and the second chip includes a chip configured in a system on chip (SoC) type.

17. The semiconductor package of claim 16, wherein the memory chip includes a dynamic random access memory (DRAM) chip, and the chip configured in the SoC type includes an application processor (AP) chip.

18. The semiconductor package of claim 14, wherein the first substrate includes first to third conductive layers sequentially stacked, the first and third conductive layers are configured to electrically connect the first and second pins to the first and second bump balls, respectively, and the second conductive layer is configured to provide a power supply voltage and a ground voltage to the first and second pins.

19. The semiconductor package of claim 18, wherein the second substrate includes fourth to sixth conductive layers sequentially stacked, the fourth and sixth conductive layers are configured to electrically connect the first and second pins to the third and fourth bump balls, respectively, and the fifth conductive layer is configured to provide a power supply voltage and a ground voltage to the first and second pins.

20. A semiconductor package comprising:
a packaging substrate;
a first package on the packaging substrate, the first package including,
    a first chip including at least one first signal pad and at least one second signal pad,
    a first substrate coupled to the at least one first signal pad and the at least one second signal pad,
    a first plurality of bump balls including,
        at least one first bump ball coupled to the at least one first signal pad through the first substrate, and
        at least one second bump ball coupled to the at least one second signal pad through the first substrate; and
a second package on the packaging substrate, the second package including,
    a second chip coupled to at least one first pin and at least one second pin, the at least one first pin configured to output a first signal and the at least one second pin configured to output a second signal,
    a second substrate,
    a second plurality of bump balls including,
        at least one third bump ball coupled to the at least one first pin through the second substrate, the at least one third bump ball being coupled to one of the first and second bump balls through the packaging substrate, and
        at least one fourth bump ball coupled to the at least one second pin through the second substrate, the fourth bump ball being coupled to another of the first and second bump balls through the packaging substrate,
wherein the first and second bump balls of the first package are in an outermost row of the first plurality of bump balls and are adjacent to a first side of the first package such that no bump balls exist between the outermost row of the first plurality of bump balls and the first side of the first package and the third and fourth bump balls of the second package are in an outermost row of the second plurality of bump balls and are adjacent to a second side of the second package such that no bump balls exist between the outermost row of the second plurality of bump balls and the second side of the second package, and the first side of the first package is adjacent to the second side of the second package,
the first side of the first package is adjacent to an edge of the first package, and
the second side of the second package is adjacent to an edge of the second package.

21. The semiconductor package of claim 20, wherein the first substrate includes a plurality of conductive layers between a plurality of insulating layers.

22. The semiconductor package of claim 21, wherein the first substrate includes,
a first conductive layer, a second conductive layer and a third conductive layer, the second conductive layer between the first and third conductive layers and configured to provide a power supply voltage and a ground voltage to the at least one first and second pads.

23. The semiconductor package of claim 20, wherein the first package and the second package are horizontally on the packaging substrate.

* * * * *